US012399318B2

United States Patent
Huang et al.

(10) Patent No.: US 12,399,318 B2
(45) Date of Patent: Aug. 26, 2025

(54) MICRO-NANO STRUCTURE SENSITIVE TO LASER BEAM IN SPECIFIC DIRECTION

(71) Applicant: SHANGHAI INSTITUTE OF MICROSYSTEM AND INFORMATION TECHNOLOGY CHINESE ACADEMY OF SCIENCES, Shanghai (CN)

(72) Inventors: Haiyang Huang, Shanghai (CN); Wei Li, Shanghai (CN); Fengyuan Gan, Shanghai (CN); Yi Zhou, Shanghai (CN)

(73) Assignee: SHANGHAI INSTITUTE OF MICROSYSTEM AND INFORMATION TECHNOLOGY CHINESE ACADEMY OF SCIENCES, Shanghai (CN)

( * ) Notice: Subject to any disclaimer, the term of this patent is extended or adjusted under 35 U.S.C. 154(b) by 219 days.

(21) Appl. No.: 18/037,088

(22) PCT Filed: Dec. 1, 2020

(86) PCT No.: PCT/CN2020/133056
§ 371 (c)(1),
(2) Date: May 16, 2023

(87) PCT Pub. No.: WO2022/104908
PCT Pub. Date: May 27, 2022

(65) Prior Publication Data
US 2024/0004130 A1 Jan. 4, 2024

(30) Foreign Application Priority Data
Nov. 17, 2020 (CN) .......................... 202011286995.4

(51) Int. Cl.
*G02B 6/122* (2006.01)
*G02B 6/12* (2006.01)

(52) U.S. Cl.
CPC .... *G02B 6/122* (2013.01); *G02B 2006/12061* (2013.01); *G02B 2006/12138* (2013.01)

(58) Field of Classification Search
CPC .......... G02B 1/122; G02B 2006/12061; G02B 2006/12138
See application file for complete search history.

(56) References Cited

U.S. PATENT DOCUMENTS

| 8,106,379 B2 * | 1/2012 | Bowers | ................. H01S 5/2224 257/14 |
| 2013/0020556 A1 | 1/2013 | Bowers | |
| 2024/0004130 A1 * | 1/2024 | Huang | .................... H10F 30/10 |

FOREIGN PATENT DOCUMENTS

| CN | 1883050 | 12/2006 |
| CN | 109659374 | 4/2019 |

(Continued)

OTHER PUBLICATIONS

"International Search Report (Form PCT/ISA/210) of PCT/CN2020/133056," mailed on Feb. 20, 2021, with English translation thereof, pp. 1-4.

*Primary Examiner* — Rhonda S Peace
(74) *Attorney, Agent, or Firm* — JCIPRNET

(57) ABSTRACT

The present invention relates to a micro-nano structure sensitive to a laser beam in a specific direction, including a substrate, wherein an insulating layer is fixedly disposed on the substrate, the insulating layer is provided with two silicon nanowires parallel to each other and having the same shape and size, lead-out nanowires are arranged at both ends of each of the silicon nanowires and are connected with a potentiometer, and a near-field coupling effect occurs (Continued)

between the silicon nanowires and the substrate when laser light irradiates the silicon nanowires, and one silicon nanowire closer to a laser light source is completely suppressed and the other silicon nanowire farther away from the laser light source maintains brightness. The present invention enables precise detection of a laser signal at a specific angle and non-contact signal transmission in a specific direction. The present invention relates to a micro nano structure sensitive to a laser beam in a specific direction. The micro nano structure comprises a substrate, wherein an insulating layer is fixedly arranged on the substrate; and two silicon wires, which are parallel to each other and are in the same shape and size, are arranged on the insulating layer, and wires are led out from two ends of each silicon wire and are connected to potential meters. When laser light irradiates the silicon wires, a near field coupling effect is generated between the silicon wires and the substrate; and one silicon wire close to a laser light source is completely inhibited, and the other silicon wire far away from the laser light source maintains the brightness thereof. By means of present invention, a laser signal at a certain specific angle can be accurately detected, and non contact signal transmission can be carried out in a specific direction.

5 Claims, 2 Drawing Sheets

(56) References Cited

FOREIGN PATENT DOCUMENTS

| | | |
|---|---|---|
| CN | 109870234 | 6/2019 |
| CN | 111834473 | 10/2020 |

* cited by examiner

MICRO-NANO STRUCTURE SENSITIVE TO LASER BEAM IN SPECIFIC DIRECTION

CROSS-REFERENCE TO RELATED APPLICATION

This application is a 371 of international application of PCT application serial no. PCT/CN2020/133056, filed on Dec. 1, 2020, which claims the priority benefits of China application no. 202011286995.4, filed on Nov. 17, 2020. The entirety of the above-mentioned patent application is hereby incorporated by reference herein and made a part of this specification.

TECHNICAL FIELD

The present invention relates to the technical field of micro-nano photonic devices and micro-systems, and in particular to a micro-nano structure sensitive to a laser beam in a specific direction.

BACKGROUND

In a micro-nanometer scale space, there are many inconveniences in how to achieve precise detection of a specific angle and non-contact signal transmission in a specific direction.

With the deep development of optoelectronic devices towards miniaturization, many technical difficulties in detection, measurement, and signal transmission within the micro-nanometer scale space are encountered, and applications of related products have a wide market space.

SUMMARY

The technical problem underlying the present invention is to provide a micro-nano structure sensitive to a laser beam at a specific direction, which enables precise detection of a laser signal at a specific angle and non-contact signal transmission in a specific direction.

The technical solution adopted by the present invention to solve its technical problem is: providing a micro-nano structure sensitive to a laser beam in a specific direction, which includes a substrate, wherein an insulating layer is fixedly disposed on the substrate, the insulating layer is provided with two silicon wires parallel to each other and having the same shape and size, lead-out wires are arranged at both ends of each of the silicon wires and are connected with a potentiometer, and a near-field coupling effect occurs between the silicon wires and the substrate when laser light irradiates the silicon wires, and one silicon wire closer to a laser light source is completely suppressed and the other silicon wire farther away from the laser light source maintains brightness.

The distance between the two silicon wires is one fifth of the wavelength of the laser light.

The thickness of the insulating layer is 15-20 nm.

The insulating layer is a transparent alumina isolation layer.

The substrate is a cuboid-shaped silver matrix.

Beneficial Effects

Due to the adoption of the technical solution described above, the present invention has the following advantages and positive effects as compared to the prior art: the present invention can be used in the micro-nanometer scale space for accurate detection of a laser signal at a specific angle and non-contact signal transmission in a specific direction, the structure has the advantages of resistance to a magnetic field, low delay, high confidentiality and low energy consumption.

DETAILED DESCRIPTION

The invention will now be further elucidated with reference to specific embodiments. It should be understood that these embodiments are merely illustrative of the invention and are not intended to limit the scope of the invention. Further, it should be understood that various changes or modifications may be made to the present invention by those skilled in the art after having read the teachings of the present invention, such equivalents also falling within the scope defined by the appended claims of this application.

Figure 1:
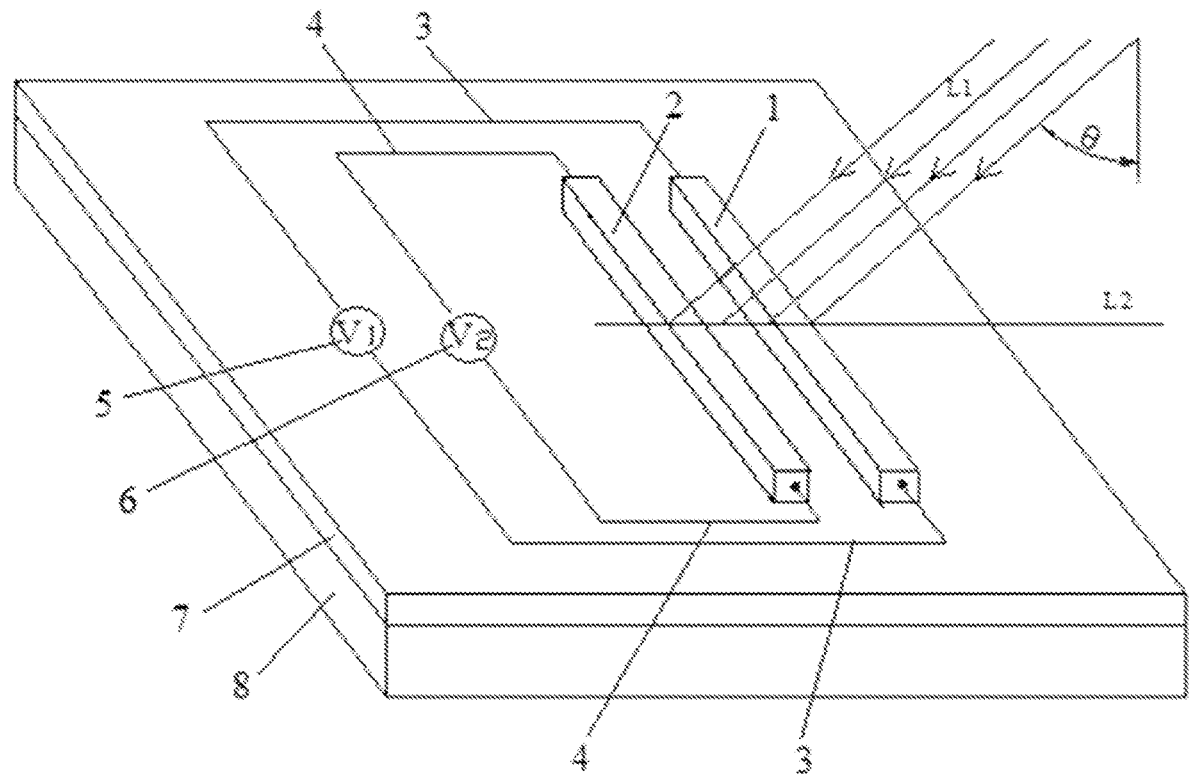
FIG. 1 is a schematic diagram of an embodiment of the present invention.

An implementation mode of the present invention relate to a micro-nano structure sensitive to a laser beam in a specific direction, as shown in FIG. 1, the structure includes a substrate, an insulating layer is fixedly disposed on the substrate, the insulating layer is provided with two silicon wires parallel to each other and having the same shape and size, lead-out wires are arranged at both ends of each of the silicon wires and are connected with a potentiometer, and a near-field coupling effect occurs between the silicon wires and the substrate when laser light irradiates the silicon wires, and one silicon wire closer to a laser light source is completely suppressed and the other silicon wire farther away from the laser light source maintains brightness.

Figure 2:
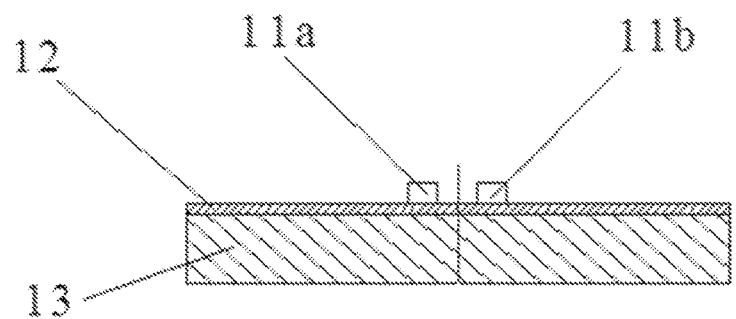
FIG. 2 is a front view of an embodiment of the present invention.

In FIG. 1, 1 and 2 are mutually parallel wires made of a silicon material, L1 is a parallel laser beam that is spatially perpendicular to the silicon wire 1 and the silicon wire 2, L2 is a projection line obtained by projecting the parallel laser beam L1 onto the plane where the silicon wire 1 and the silicon wire 2 are located, θ is the incidence angle (an acute angle sandwiched between the parallel laser beam L1 and the normal of the plane where the silicon wire 1 and the silicon wire 2 are located), 7 is a transparent alumina isolation layer (the insulating layer) with a specific thickness, and 8 is a silver substrate. The silicon wires 1 and 2 are fixedly connected on the isolation layer 7 which is fixedly connected to the silver substrate 8. 3 and 4 are lead-out wires which are fixedly connected with both ends of the silicon wire 1 and the silicon wire 2, 5 and 6 are potentiometers, the potential differences between both ends of the silicon wire 1 and the silicon wire 2 can be measured by the lead-out wires 3 and 4, respectively.

When a single silicon wire is irradiated by the laser, the silicon wire is illuminated while a potential difference is generated between both ends of the silicon wire. In FIG. 1, for the parallel laser beam L1 of a specific wavelength (e.g., the light source wavelength range is 700-750 nm), if the distance between the silicon wire 1 and the silicon wire 2 and the thickness of the alumina isolation layer 7 are appropriate (e.g., the distance between the wires 1 and 2 is one fifth of the optical wavelength and the thickness of the alumina isolation layer 7 is 15-20 nm), the two mutually parallel silicon wires 1 and 2 and the silver substrate 8 in this case together constitute a resonator, and under illumination by the parallel laser beam L1, the near field coupling effect occurs between the silicon wires 1 and 2 and the silver substrate 8, at this time, the brightness of the silicon wires 1 and 2 and the potential differences between both ends are changed. According to the coupled mode theory, the potential differences between both ends of the silicon wires 1 and 2 are related to the incidence angle θ, in particular, with carefully-designed parameters, it can be achieved that the resonator amplitude is completely suppressed at a specific incidence angle $θ_0$, i.e., the potential difference between both ends of the silicon wire 1 closer to the light source tends towards zero, while the potential difference between both ends of the silicon wire 2 farther from the light source does not change significantly, and the laser incidence angle $θ_0$ at this position is referred to as the coupling incidence angle. In order to improve the detection sensitivity, it is possible to determine whether or not the light incidence angle is the coupling incidence angle $θ_0$ on the basis of the ratio of the potential differences between both ends of the silicon wire 1 and the silicon wire 2: then when the light incidence angle is the coupling incidence angle $θ_0$, the ratio of the potential differences between both ends of the silicon wire 1 and the silicon wire 2 reaches an extreme value. According to this principle, the structure can accurately detect the value of the coupling incidence angle $θ_0$ and can also be used for non-contact reception of signals in a specific direction in a tiny space.

Figure 3:
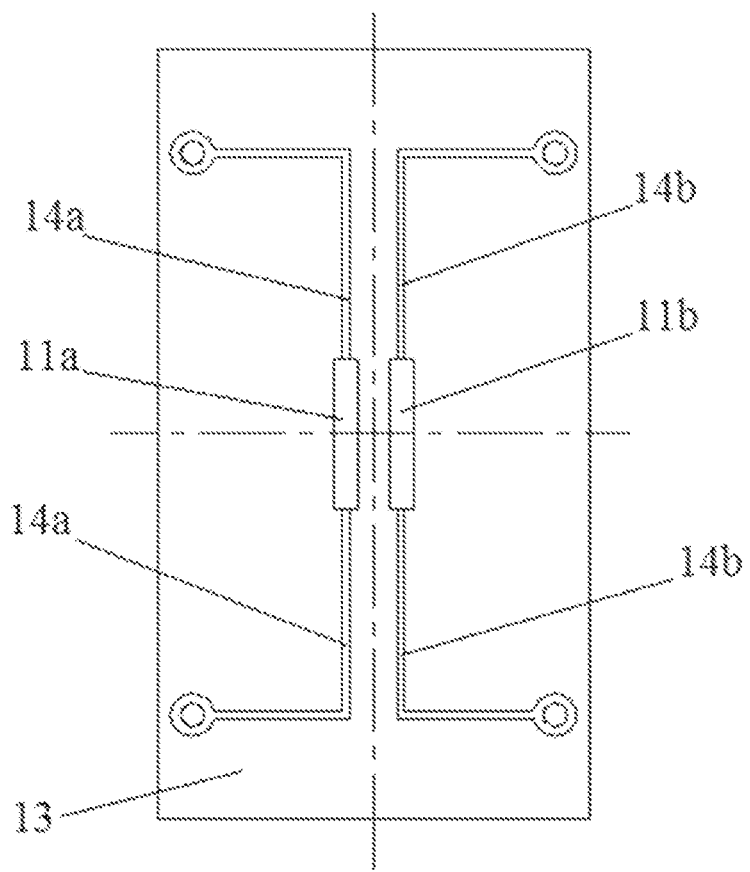
FIG. 3 is a top view of an embodiment of the present invention.

In FIGS. 2 and 3, 13 is a fixed-position silver matrix with a cuboid shape, a transparent alumina isolation layer (insulating layer) 12 having a specific thickness is fixed on the silver matrix 13, on the transparent alumina isolation layer (insulating layer) 12, two silicon wires 11a and 11b which are parallel to each other and having the same shape and size are fixedly provided, both ends of the silicon wire 11a are provided with lead-out wires 14a according to the principle of FIG. 1 in order to measure the potential difference between both ends of the wire, and both ends of the silicon wire 11b are provided with lead-out wires 14b according to the principle of FIG. 1 in order to measure the potential difference between both ends of the wire.

The structure of the present implementation mode may be processed by conventional lithographic techniques. The main parameters include: the cross-section of a single silicon wire is 60*100 nm, the spacing between centers is 145 nm, and the material of the matrix 13 is metallic silver. By using conventional micro-nano fabrication processes, silicon wires are etched on the SOI wafer by electron beam lithography, then the alumina isolation layer (15-20 nm) is deposited by the ALD process, and then the silver substrate is deposited by electron beam evaporation.

When the light source has a wavelength of 727 nm and an incidence angle of 50°, the silicon wire closer to the light source in the above structure can achieve complete suppression (the silicon wire darkens and the potential difference between both ends is close to zero), while the other silicon wire farther from the light source maintains specific brightness and has a specific potential difference between both ends.

It is not difficult to find that the invention can be used in the micro-nano scale space range to accurately detect laser signals at a specific angle and carry out non-contact signal transmission along a specific direction, etc. The structure has the advantages of magnetic field resistance, low delay, strong confidentiality, low energy consumption and the like.

What is claimed is:

1. A micro-nano structure sensitive to a laser beam in a specific direction, comprising a substrate, wherein an insulating layer is fixedly disposed on the substrate, the insulating layer is provided with two silicon wires parallel to each other and having the same shape and size, lead-out wires are arranged at both ends of each of the silicon wires and are connected with a potentiometer, and a near-field coupling effect occurs between the silicon wires and the substrate when a laser light irradiates the silicon wires, and one silicon wire closer to a laser light source is completely suppressed and the other silicon wire farther away from the laser light source maintains brightness.

2. The micro-nano structure sensitive to the laser beam in the specific direction according to claim 1, wherein a distance between the two silicon wires is one fifth of a wavelength of the laser light.

3. The micro-nano structure sensitive to the laser beam in the specific direction according to claim 1, wherein a thickness of the insulating layer is 15-20 nm.

4. The micro-nano structure sensitive to the laser beam in the specific direction according to claim 1, wherein the insulating layer is a transparent alumina isolation layer.

5. The micro-nano structure sensitive to the laser beam in the specific direction according to claim 1, wherein the substrate is a cuboid-shaped silver matrix.

* * * * *